(12) United States Patent
Ho et al.

(10) Patent No.: US 6,665,216 B1
(45) Date of Patent: Dec. 16, 2003

(54) APPARATUS AND SYSTEM FOR READING NON-VOLATILE MEMORY WITH DUAL REFERENCE CELLS

(75) Inventors: Hsin-Yi Ho, Hsinchu (TW); Nai-Ping Kuo, Hsinchu (TW); Chun-Hsiung Hung, Hsinchu (TW); Gin-Laing Chen, Hsinchu (TW); Wen-Chiao Ho, Hsinchu (TW); Ho-Chun Liou, Hsinchu (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 10/202,245

(22) Filed: Jul. 23, 2002

(51) Int. Cl.[7] ................................................ G11C 7/00
(52) U.S. Cl. ...................... 365/189.07; 365/189.09; 365/207
(58) Field of Search ................. 365/189.07, 189.09, 365/207, 210, 226, 189.04, 189.01

(56) References Cited

U.S. PATENT DOCUMENTS

| | | | | |
|---|---|---|---|---|
| 5,798,730 A | * | 8/1998 | Sanchez | 327/24 |
| 5,831,302 A | * | 11/1998 | McIntyre | 365/226 |
| 6,314,028 B1 | * | 11/2001 | Kono | 365/189.09 |
| 6,356,499 B1 | * | 3/2002 | Banba et al. | 365/226 |
| 2002/0057604 A1 | * | 5/2002 | Khouri et al. | 265/200 |

* cited by examiner

Primary Examiner—Thong Le
(74) Attorney, Agent, or Firm—Martine & Penilla, LLP (57) ABSTRACT

A system for reading data in a memory cell includes three comparators, each of which has two inputs. A first reference cell having a low reference voltage is coupled to one input of the first comparator. A second reference cell having a high reference voltage is coupled to one input of the second comparator. A memory cell having a memory cell voltage is coupled to the other input of the first and second comparators. One input of the third comparator is coupled to the first comparator's output signal, which includes a difference voltage between the memory cell voltage and the low reference voltage. The other input of the third comparator is coupled to the second comparator's output signal, which includes a difference voltage between the memory cell voltage and the high reference voltage. A method and apparatus for reading data in a memory cell also are described.

20 Claims, 6 Drawing Sheets

APPARATUS AND SYSTEM FOR READING NON-VOLATILE MEMORY WITH DUAL REFERENCE CELLS

BACKGROUND OF THE INVENTION

1. Field of the Invention

The present invention relates generally to digital memory systems and, more particularly, to methods and systems for reading data stored in a memory cell.

2. Description of the Related Art

Memory systems typically include an array of separate memory cells. Each memory cell stores one data bit (i.e., a "1" or a "0" state). In an EPROM such as an EEPROM, a flash EPROM, or a flash EEPROM, the data stored in each memory cell must be verified. One method of verifying the contents of the data stored in each memory cell is to compare a cell output voltage of the memory cell to a reference output voltage of a reference cell. The reference cell voltage may be the equivalent of a "1" or a "0" state. The cell output voltage is compared to the reference output voltage. If the cell output voltage is the same as the reference output voltage, then the memory cell is verified as having the same state as the reference cell. The state of the memory cell is then compared to the data that is intended to be stored in the memory cell. If the memory cell has the correct state, then a next memory cell is similarly tested. If the memory cell does not have the correct state, then the memory cell must be reprogrammed.

One of the problems of the above process is that, as semiconductor device structures have become smaller, the speeds of the devices have increased, and the operating voltages have been reduced. For example, in many early generations of semiconductor devices, a "1" state was represented by a 5 VDC output voltage and a "0" state was represented by a 0 VDC (i.e., ground) output voltage. In more recent device structures a "1" state has been represented by a 1 VDC or even less (e.g., 0.6 VDC) output voltage, while a "0" state still has been represented by a 0 VDC (e.g., ground) output voltage. Further, the 0 VDC can often be slightly above ground potential such as 0.1 VDC. As the voltage difference between a "1" state and a "0" state has decreased, the process of determining whether a given device is in a "1" or "0" state becomes more finite and typically slower. The process has become more finite because the voltage difference is small (e.g., less than 1 VDC) and therefore requires very specific measurement. Because the process is more finite and because the voltage is so small, the process also has become slower. The output voltage typically must be allowed to rise to a near maximum voltage before the output voltage can be accurately measured.

Figure 1:
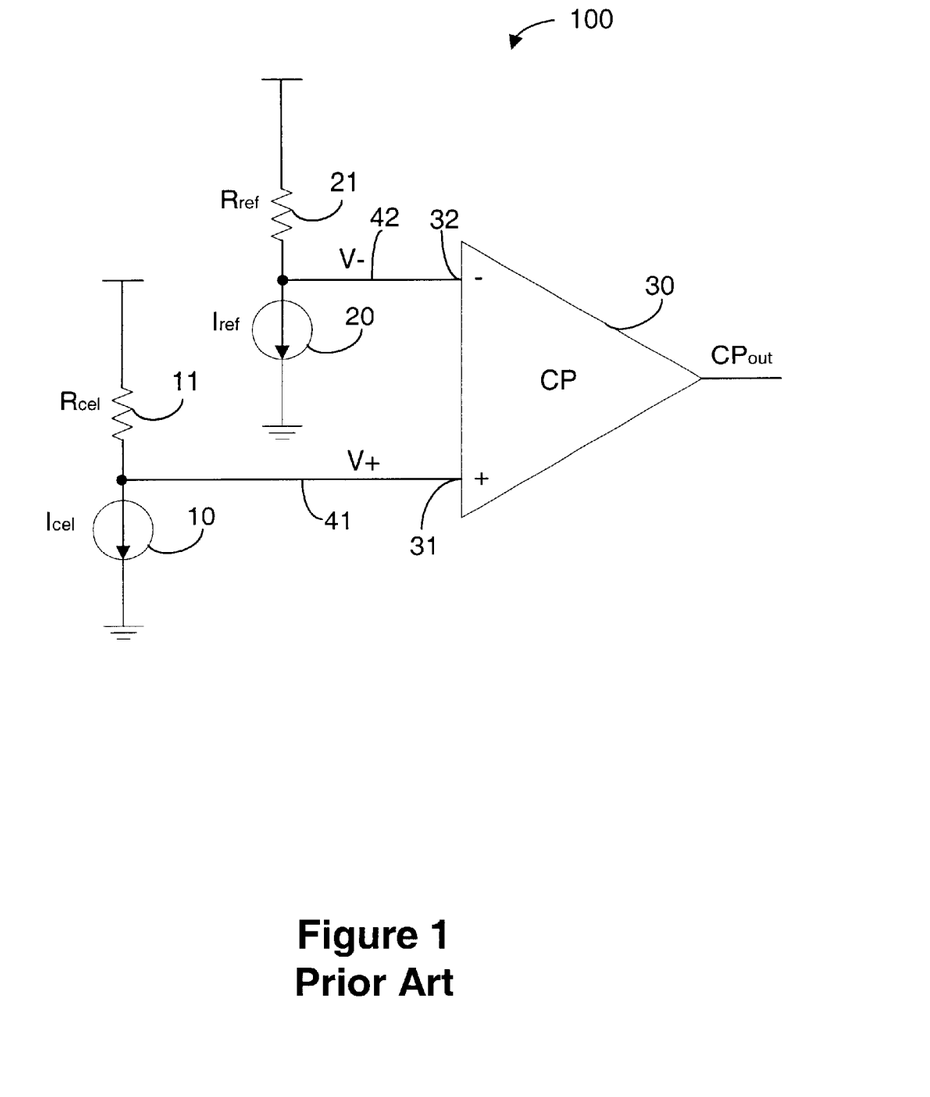
FIG. 1 is a schematic diagram of a prior art circuit for comparing a single reference cell to a memory cell.

FIG. 1 is a schematic diagram of a prior art circuit 100 for comparing a single reference cell 20 to a memory cell 10. The memory cell 10 generates a memory cell current when a gate potential is applied to the memory cell's word line. The memory cell current is compared to a current from a reference cell 20 by the comparator 30. Typically, EPROMs employ a column of UV-erased cells, which are identical in structure to the memory cells and act as the reference cells. The comparator 30 determines whether the memory cell 10 being verified is drawing more or less current than the reference cell 20, which is weighted in some relationship to the memory cell 10. In doing so, the comparator 30 verifies the program state of the memory cell 10.

As both the memory cell 10 and the reference cell 20 of the typical EPROM are UV-erased, each has a different distribution of currents. Normally, this difference in distribution prevents the currents from being compared directly because of the possibility that an erased memory cell being verified could appear to be programmed and vice versa. To resolve this problem, a resistive load (such as $R_{ref}$) is used to effectively divide or weight the reference current, $I_{ref}$. The typical load used is one-half or one-third that of the load $R_{cel}$ for the memory cell 10, resulting in a 2 to 1 or 3 to 1 load ratio. Currents also have been compared using other load ratios.

In FIG. 1, memory cell 10 is a transistor that represents a typical array memory cell such as in a "flash" EPROM. The memory cell 10 is coupled to a positive input 31 of comparator 30 via line 41. A potential applied to the gate of memory cell 10 puts the cell into conduction, provided the potential is greater than the cell's threshold potential, $V_{t1 (cel)}$. Reference cell 20 is the reference cell for memory cell 10 and is used to produce a reference current, $I_{ref}$, which is used to determine the presence of a charge in the memory cell 10. The reference cell 20 is coupled to the negative input 32 of comparator 30 via line 42. A potential applied to the gate of reference cell 20 puts the reference cell into conduction if the potential is greater than its threshold potential, $V_{t1(ref)}$. When the program state of memory cell 10 is being verified, a gate potential, $V_{WL1(cel)}$, is applied to the memory cell 10 and a gate potential, $V_{WL1(ref)}$, is applied to reference cell 20 to produce a memory cell current, $I_{cel}$, and a reference cell current, $I_{ref}$, respectively. When currents $I_{cel}$ and $I_{ref}$ are conducting, array side load resistance $R_{cel}$ 11 and reference cell side load resistance $R_{ref}$ 21 create voltages V+ and V−, respectively. Voltages V+ and V− represent the input voltages to comparator 30.

If both cells 10 and 20 are conducting, then the input voltages to comparator 30 are depicted by the following approximate or first order equations:

TABLE 1

| |  |
|---|---|
| $V+ = I_{cel}R_{cel} = (½)$ beta $(V_{WL1(cel)} - V_{t1(cel)})R_{cel}$ | (1) |
| $V- = I_{ref}R_{ref} = (½)$ beta $(V_{WL1(ref)} - V_{t1(ref)})R_{ref}$ | (2) |

The output signal of the comparator 30, CPout, changes state or "trips" when:

TABLE 2

| |  |
|---|---|
| V+ and V− are equal: | |
| $(V_{W1(cel)} - V_{t1(cel)})R_{(cel)} = (V_{WL1(ref)} - V_{t1(ref)})R_{(ref)}$ | (3) |

As described above, the comparator 30 amplifies the difference between the V+ and V−. If the memory cell 10 is conducting and the reference cell 20 is not conducting, then the difference output from the comparator 30 can still be quite small and therefore slow to change state. As a result, verifying each of the many thousands of memory cells in an entire programmed memory array will require an excessive amount of time.

Therefore, in view of the foregoing, what is needed is a method and apparatus for quickly and accurately verifying the programmed state of each memory cell in a programmed memory array.

SUMMARY OF THE INVENTION

Broadly speaking, the present invention fills these needs by using dual reference cells to read or verify data in a memory cell. By way of example, the present invention may be implemented in the form of a system, an apparatus, a method, a device, or a computer readable media.

In accordance with one aspect of the present invention, a system for reading data in a memory cell is provided. This system includes first, second, and third comparators, each of which has a first input and a second input. A first reference cell having a low reference voltage is coupled to the first input of the first comparator. A second reference cell having a high reference voltage is coupled to the first input of the second comparator. A memory cell having a memory cell voltage is coupled to the second input of both the first comparator and also the second comparator. The first input of the third comparator is coupled to an output signal of the first comparator, which includes a difference voltage between the memory cell voltage and the low reference voltage. The second input of the third comparator is coupled to an output signal of the second comparator, which includes a difference voltage between the memory cell voltage and the high reference voltage.

In one embodiment, the output signal of the third comparator is a representation of data stored in the memory cell. In one embodiment, the low reference voltage is substantially equal to the memory cell voltage when the memory cell is in a low voltage state. In one embodiment, the high reference voltage is substantially equal to the memory cell voltage when the memory cell is in a high voltage state. In one embodiment, the first reference cell is coupled to ground such that the low reference voltage is substantially equal to the ground potential. In one embodiment, the first reference cell includes a first voltage divider circuit and the second reference cell includes a second voltage divider circuit.

In accordance with another aspect of the present invention, an apparatus for reading data contained in a memory cell is provided. This apparatus includes a first reference cell having a high threshold voltage for providing a low reference current. A second reference cell having a low threshold voltage provides a high reference current. A first load receives the high reference current and outputs a first reference voltage. A second load receives the low reference current and outputs a second reference voltage. A first comparator receives the first reference voltage and a memory cell voltage and generates an output signal. A second comparator receives the second reference voltage and the memory cell voltage and generates an output signal. A third comparator receives the output signals from the first and second comparators and generates an output signal.

In one embodiment, the output signal from the third comparator represents data contained in the memory cell. In one embodiment, the first and second loads include at least one resistor. In one embodiment, the first and second loads include at least one capacitor.

In accordance with yet another aspect of the present invention, a method for reading data in a memory cell is provided. In this method a first reference cell voltage is compared with a memory cell voltage from a memory cell to produce a first output signal. A second reference cell voltage is compared with the memory cell voltage to produce a second output signal. The first output signal is then compared with the second output signal to produce a third output signal.

In one embodiment, the first reference cell is a low reference voltage and the second reference cell is a high reference voltage. In one embodiment, the low reference voltage is substantially equal to the memory cell voltage when the memory cell is in a low voltage state. In one embodiment, the low reference voltage is substantially equal to a ground potential. In one embodiment, the third output signal is a representation of data in the memory cell. In one embodiment, the first reference cell includes a first voltage divider circuit and the second reference cell includes a second voltage divider circuit.

One advantage of the present invention is that the representation of the stored data is amplified by combining the differences between the memory cell state and both a reference "1" state and also a reference "0" state. The resulting representation of the stored data can be detected more accurately and more quickly than in conventional systems and methods that use only a single reference cell.

Other aspects and advantages of the invention will become apparent from the following detailed description, taken in conjunction with the accompanying drawings, illustrating by way of example the principles of the invention.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF EXEMPLARY EMBODIMENTS

Several exemplary embodiments for using dual reference cells to read or verify data in a memory cell will now be described. It will be apparent to those skilled in the art that the present invention may be practiced without some or all of the specific details set forth herein.

Memory system manufacturers are under constant pressure to increase memory speed so that a memory access (e.g., read/write) does not delay or stall a computer system operation. One aspect of increasing memory access speed is the time required for storing and verifying data stored in non-volatile memory. Prior art systems and methods of verifying data are typically relatively slow, as discussed above with reference to FIG. 1.

Increasing the verification speed can allow non-volatile memory systems, such as flash-type memory systems, to be used in applications that require faster overall memory access time. Thereby more applications can exploit the benefits of non-volatile memory (e.g., maintaining data integrity without requiring power, etc.) without suffering excessive memory access delays. For example, many devices such as digital cameras and personal digital assistants (PDAs) use portable memory cards. The portable memory cards typically include flash memory-type memory systems. A portable memory card with a faster access and verification speed allows a first device (e.g., a digital camera) to quickly store and verify data on the memory card and thereby respond more quickly and allow a user to use the camera more quickly (e.g., take pictures in rapid succession). When the user is finished taking pictures, the memory card can be removed from the digital camera and can be coupled to a second device (e.g., a personal computer). The personal computer can then access and manipulate the data (e.g., digital images) stored on the memory card.

Figure 2:
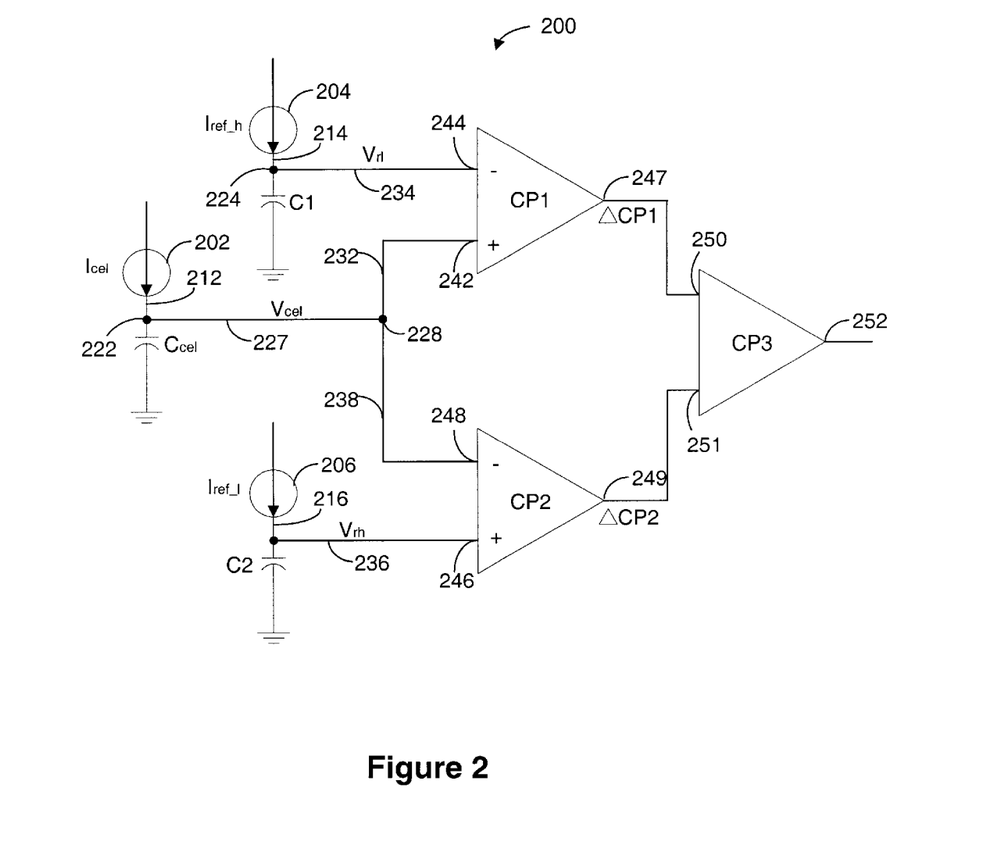
FIG. 2 is a schematic diagram of a circuit for verifying data in a memory cell using two reference cells in accordance with one embodiment of the present invention.

FIG. 2 is a schematic diagram of a circuit 200 for verifying data in a memory cell using two reference cells in accordance with one embodiment of the present invention. Memory cell 202 outputs a cell current $I_{ce}$, through output conductor 212 to node 222. Capacitor $C_{cel}$ is coupled between node 222 and ground. Node 222 couples cell voltage $V_{cel}$ to node 228 through conductor 227. Node 228 couples cell voltage $V_{cel}$ to the positive input 242 of comparator CP1 through conductor 232. Node 228 also couples cell voltage $V_{cel}$ to the negative input 248 of comparator CP2 through conductor 238.

A first reference cell 204 outputs a high reference cell current $I_{ref\_h}$ through output 214 to node 224. Capacitor C1 is coupled between node 224 and ground. Node 224 couples a low reference voltage $V_{r1}$ to a negative input 244 of comparator CP1 through conductor 234. A second reference cell 206 outputs a low reference cell current $I_{ref\_1}$ through output 216 to node 226. Capacitor C2 is coupled between node 226 and ground. Node 226 couples a high reference voltage $V_{rh}$ to a positive input 246 of comparator CP2 through conductor 236. The output 247 ($\Delta$CP1) of CP1 is coupled to a first input 250 of a third comparator CP3. The output 249 ($\Delta$CP2) of CP2 is coupled to a second input 251 of the comparator CP3. Comparator CP3 outputs a signal through output 252.

In operation, the cell current $I_{cel}$ flows through node 222 and capacitor $C_{cel}$ to ground, which produces the cell voltage $V_{cel}$ across the capacitive load made up of capacitor $C_{cel}$. The cell voltage $V_{cel}$ is then coupled from node 222 to the positive input 242 of comparator CP1 and the negative input 248 of comparator CP2. The reference cell 204 has a low threshold voltage $V_{t\_r1}$ and produces a high reference current $I_{ref\_h}$. The high reference cell current $I_{ref\_h}$ flows through node 224 and capacitor C1 to ground, which produces the low reference voltage $V_{r1}$ across the capacitive load of capacitor C1. The low reference voltage $V_{r1}$ is coupled from node 224 to the negative input 244 of comparator CP1. The reference cell 206 has a high threshold voltage $V_{t\_rh}$ and produces a low reference current $I_{ref\_1}$. The low reference cell current $I_{ref\_1}$ flows through node 226 and capacitor C2 to ground, which produces the high reference voltage $V_{rh}$ across the capacitive load of capacitor C2. The high reference voltage $V_{rh}$ is coupled from node 226 to the positive input 246 of comparator CP2. Those skilled in the art will appreciate that, if desired, capacitive loads $C_{cel}$, C1, and C2 may include or be replaced by resistive loads.

CP1 amplifies the difference voltage between the low reference voltage $V_{r1}$ and the cell voltage $V_{cel}$ to produce a difference output voltage $\Delta$CP1. CP2 amplifies the difference voltage between the high reference voltage $V_{rh}$ and the cell voltage $V_{cel}$ to produce a difference output voltage $\Delta$CP2. $\Delta$CP1 and $\Delta$CP2 are then applied to inputs 250 and 251, respectively, of comparator CP3. Comparator CP3 amplifies the difference voltage between $\Delta$CP1 and $\Delta$CP2 to output a $\Delta$CP3 signal at the output 252 of comparator CP3. The $\Delta$CP3 signal represents an amplified data signal of the data stored in the memory cell 202.

In one embodiment, the high reference voltage $V_{rh}$ is substantially equal to a cell voltage $V_{cel}$ from a memory cell in the high output voltage state (i.e., a binary "1" state, or a binary "0" state in inverted logic). In one embodiment, the low reference voltage $V_{r1}$ is substantially equal to a cell voltage $V_{cel}$ from a memory cell in the low output voltage state (i.e., a binary "0" state, or a binary "1" state in inverted logic).

Figure 3:
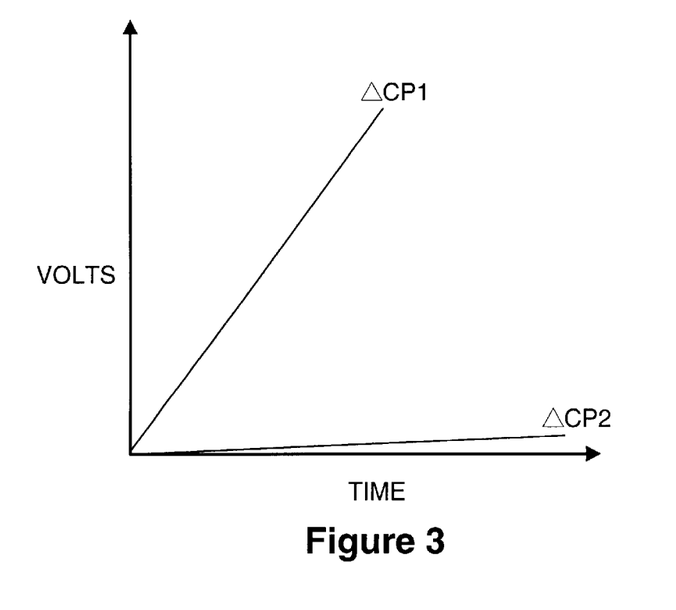
FIG. 3 is a graph of the relationship of signals ΔCP1 and ΔCP2 when the memory cell has a high threshold voltage.

FIG. 3 is a graph of the relationship of signals $\Delta$CP1 and $\Delta$CP2 when the memory cell 202 has a high threshold voltage. Referring to the elements shown in FIG. 2, when both memory cell 202 and reference cell 206 have a high threshold voltage, the difference between the two signals, as amplified in comparator CP2 (i.e., $\Delta$CP2) is quite small, as shown by the line labeled $\Delta$CP2 in FIG. 3. In contrast, when the memory cell 202 has a high threshold voltage and the reference cell 204 has a low threshold voltage, the difference voltage between the two signals, as amplified in comparator CP1 (i.e., $\Delta$CP1) is quite large, as shown by the line labeled $\Delta$CP1 in FIG. 3.

Figure 4:
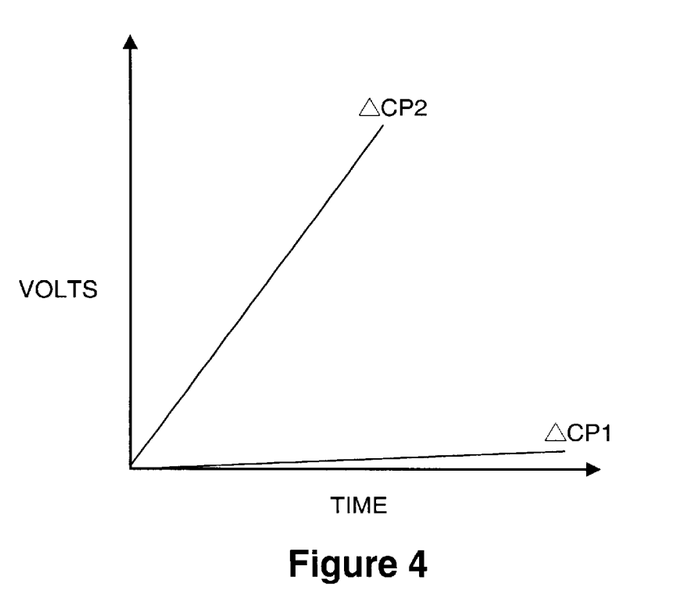
FIG. 4 is a graph of the relationship of signals ΔCP1 and ΔCP2 when the memory cell has a low threshold voltage.

FIG. 4 is a graph of the relationship of signals $\Delta$CP1 and $\Delta$CP2 when the memory cell has a low threshold voltage. Referring to the elements shown in FIG. 2, when both memory cell 202 and reference cell 204 have a low threshold voltage, the difference between the two signals, as amplified in comparator CP1 (i.e., $\Delta$CP1) is quite small, as shown by the line labeled $\Delta$CP1 in FIG. 4. In contrast, when the memory cell 202 has a high threshold voltage and the reference cell 206 has a high threshold voltage, the difference voltage between the two signals, as amplified in comparator CP2 (i.e., $\Delta$CP2) is quite large, as shown by the line labeled $\Delta$CP2 in FIG. 4.

The difference between $\Delta$CP1 and $\Delta$CP2 is a representation of the data in the memory cell. For example, if the difference between $\Delta$CP1 and $\Delta$CP2 is a logic high, then the memory cell includes a logic high. Alternatively, if the difference between $\Delta$CP1 and $\Delta$CP2 is a logic low, then the memory cell includes a logic low. The difference between $\Delta$CP1 and $\Delta$CP2 is greater than the difference obtained when the level of the memory cell is compared to one reference cell in accordance with conventional practice. Consequently, the resulting output signal can be detected more easily and more quickly and, in turn, the state of the data cell can be verified more quickly.

Figure 5:
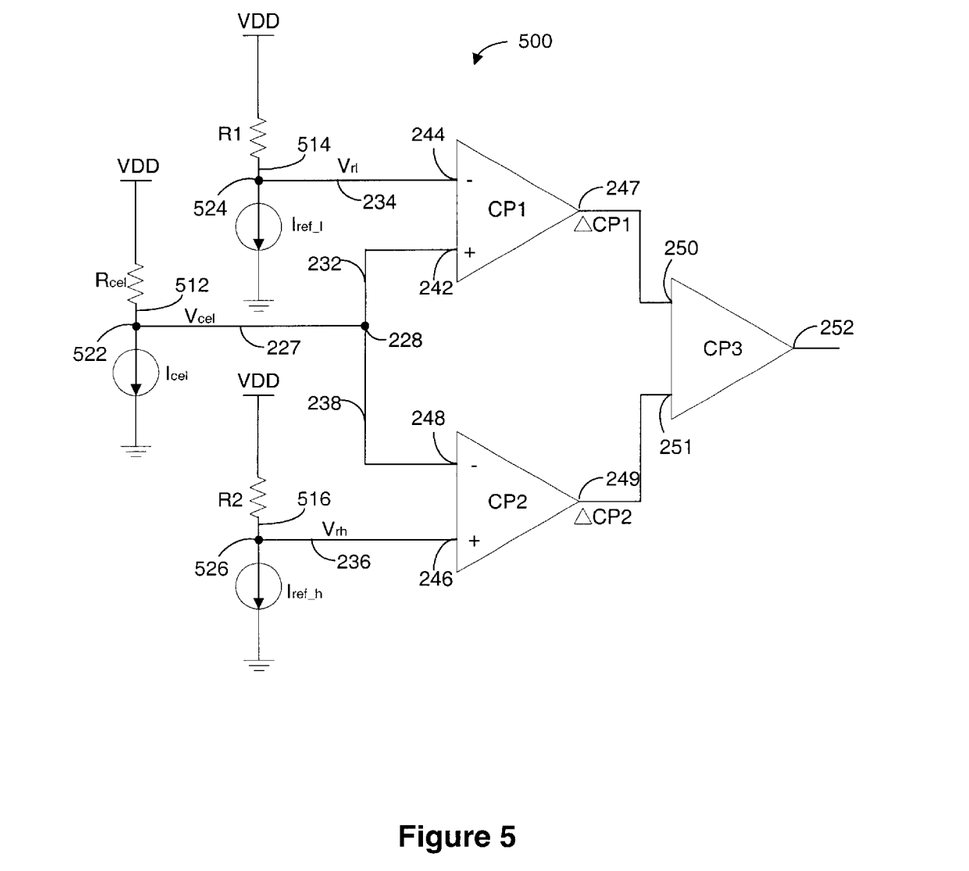
FIG. 5 is a schematic diagram of a circuit for verifying data in a memory cell using two reference cells in accordance with another embodiment of the present invention.

FIG. 5 is a schematic diagram of a circuit 500 for verifying data in a memory cell using two reference cells in accordance with another embodiment of the present invention. Circuit 500 differs from circuit 200 shown in FIG. 2 in that the reference cells 204, 206 have been replaced by voltage dividers represented by resistors R1 and R2, respectively. Resistors R1 and R2 produce a low reference voltage $V_{r1}$ across resistor R1 and a high reference voltage $V_{rh}$ across resistor R2 by passing the respective currents $I_{ref\_1}$ and $I_{ref\_h}$ through the resistors to ground.

With reference to FIG. 5, the memory cell draws a cell current $I_{cel}$ through output conductor 512 to node 522. Resistor $R_{cel}$ is coupled between VDD and node 522. Node 522 couples cell voltage $V_{cel}$ to node 228 through conductor 227. Node 228 couples cell voltage $V_{cel}$ to the positive input 242 of comparator CP1 through conductor 232. Node 228 also couples cell voltage $V_{cel}$ to the negative input 248 of comparator CP2 through conductor 238.

A first reference voltage divider R1 outputs a low reference cell current $I_{ref\_1}$ to node 524 through output 514 to node 524. Resistor R1 is coupled between VDD and node 524. Node 524 couples a low reference voltage $V_{r1}$ to a negative input 244 of comparator CP1 through conductor 234. A second reference voltage divider R2 outputs a high reference cell current $I_{ref\_h}$ through output 516 to node 526. Resistor R2 is coupled between VDD and node 526. Node 526 couples a high reference voltage $V_{rh}$ to a positive input 246 of comparator CP2 through conductor 236. The output 247 (ΔCP1) of CP1 is coupled to a first input 250 of a third comparator CP3. The output 249 (ΔCP2) of CP2 is coupled to a second input 251 of the comparator CP3. Comparator CP3 outputs a signal through output 252.

In operation, the cell current $I_{cel}$ flows through resistor $R_{cel}$ to node 522, which produces the cell voltage $V_{cel}$ across resistor $R_{cel}$. The cell voltage $V_{cel}$ is then coupled from node 522 to the positive input 242 of comparator CP1 and the negative input 248 of comparator CP2. The first reference voltage divider R1 has a high resistance and produces a low reference current $I_{ref\_1}$. The low reference cell current $I_{ref\_1}$ flows from VDD through resistor R1 and node 524 to ground, which produces the low reference voltage $V_{r1}$ across resistor R1. The low reference voltage $V_{r1}$ is coupled from node 524 to the negative input 244 of comparator CP1. The second reference voltage divider R2 has a low resistance and produces a high reference current $I_{ref\_h}$. The high reference cell current $I_{ref\_h}$ flows from VDD through resistor R2 and node 526 to ground, which produces the high reference voltage $V_{rh}$ across resistor R2. The high reference voltage $V_{rh}$ is coupled from node 526 to the positive input 246 of comparator CP2.

CP1 amplifies the difference voltage of the low reference voltage $V_{r1}$ and the cell voltage $V_{cel}$ to produce a difference output voltage ΔCP1. CP2 amplifies the difference voltage of the high reference voltage $V_{rh}$ and the cell voltage $V_{cel}$ to produce a difference output voltage ΔCP2. ΔCP1 and ΔCP2 are then applied to inputs 250 and 251, respectively, of comparator CP3. Comparator CP3 amplifies the difference voltage of the ΔCP1 and ΔCP2 to output a ΔCP3 signal at the output 252 of comparator CP3. The ΔCP3 signal represents an amplified data signal of the data stored in the memory cell.

Figure 6:
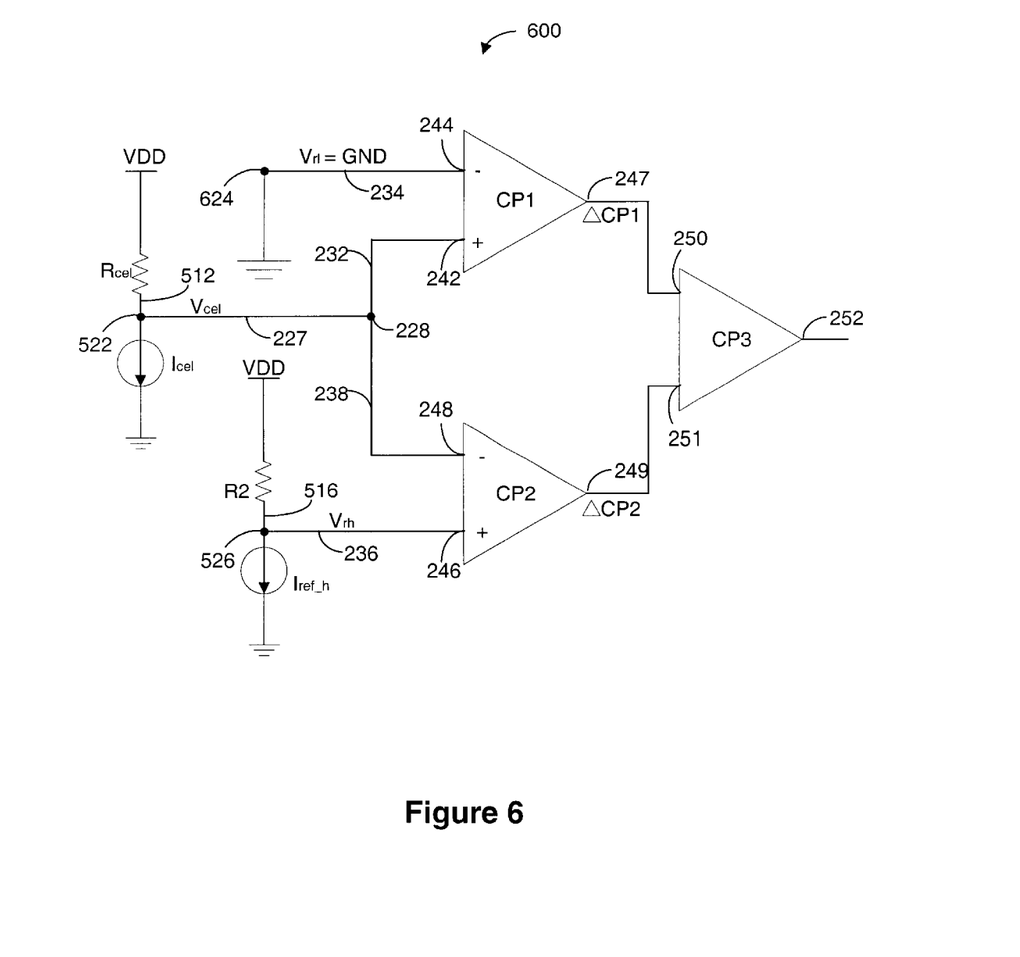
FIG. 6 is a schematic diagram of a circuit for verifying data in a memory cell using two reference cells in accordance with yet another embodiment of the present invention.

FIG. 6 is a schematic diagram of a circuit 600 for verifying data in a memory cell using two reference cells in accordance with yet another embodiment of the present invention. Circuit 600 differs from circuit 500 shown in FIG. 5 in that the first voltage divider R1 has been replaced by a direct connection to ground potential.

With reference to FIG. 6, memory cell draws a cell current $I_{cel}$ through output conductor 512 to node 522. Resistor $R_{cel}$, is coupled between VDD and node 522. Node 522 couples cell voltage $V_{cel}$ to node 628. Node 528 couples cell voltage $V_{cel}$ to the positive input 242 of comparator CP1 and the negative input 248 of comparator 5P2. The negative input 244 of comparator CP1 is tied to a low reference voltage such as a ground potential through node 624. A second reference voltage divider R2 outputs a high reference cell current $I_{ref\_h}$ through output 516 to node 526. Resistor R2 is coupled between VDD and node 526. Node 526 couples a high reference voltage $V_{rh}$ to a positive input 246 of comparator CP2. The output 247 (ΔCP1) of CP1 is coupled to a first input 250 of a third comparator CP3. The output 249 (ΔCP2) of CP2 is coupled to a second input 251 of the comparator CP3. Comparator CP3 outputs a signal through output 252.

In operation, the cell current $I_{cel}$ flows through resistor $R_{cel}$ to node 522, which produces the cell voltage $V_{cel}$ across resistor $R_{cel}$. The cell voltage $V_{cel}$ is then coupled from node 522 to the positive input 242 of comparator CP1 and the negative input 248 of comparator CP2. The low reference voltage (e.g., ground potential) $V_{r1\ is}$ coupled from node 624 to the negative input 244 of comparator CP1. The second reference voltage divider R2 has a low resistance and produces a high reference current $I_{ref\_h}$. The high reference cell current $I_{ref\_h}$ flows from VDD through resistor R2 and node 526 to ground, which produces the high reference voltage $V_{rh}$ across resistor R2. The high reference voltage $V_{rh}$ is coupled from node 526 to the positive input 246 of comparator CP2.

CP1 amplifies the difference voltage of the low reference voltage $V_{r1}$ and the cell voltage $V_{cel}$ to produce a difference output voltage ΔCP1. CP2 amplifies the difference voltage of the high reference voltage $V_{rh}$ and the cell voltage $V_{cel}$ to produce a difference output voltage ΔCP2. ΔCP1 and ΔCP2 are then applied to inputs 250 and 251, respectively, of comparator CP3. Comparator CP3 amplifies the difference voltage of the ΔCP1 and ΔCP2 to output a ΔCP3 signal at the output 252 of comparator CP3. The ΔCP3 signal represents an amplified data signal of the data stored in the memory cell.

Figure 7:
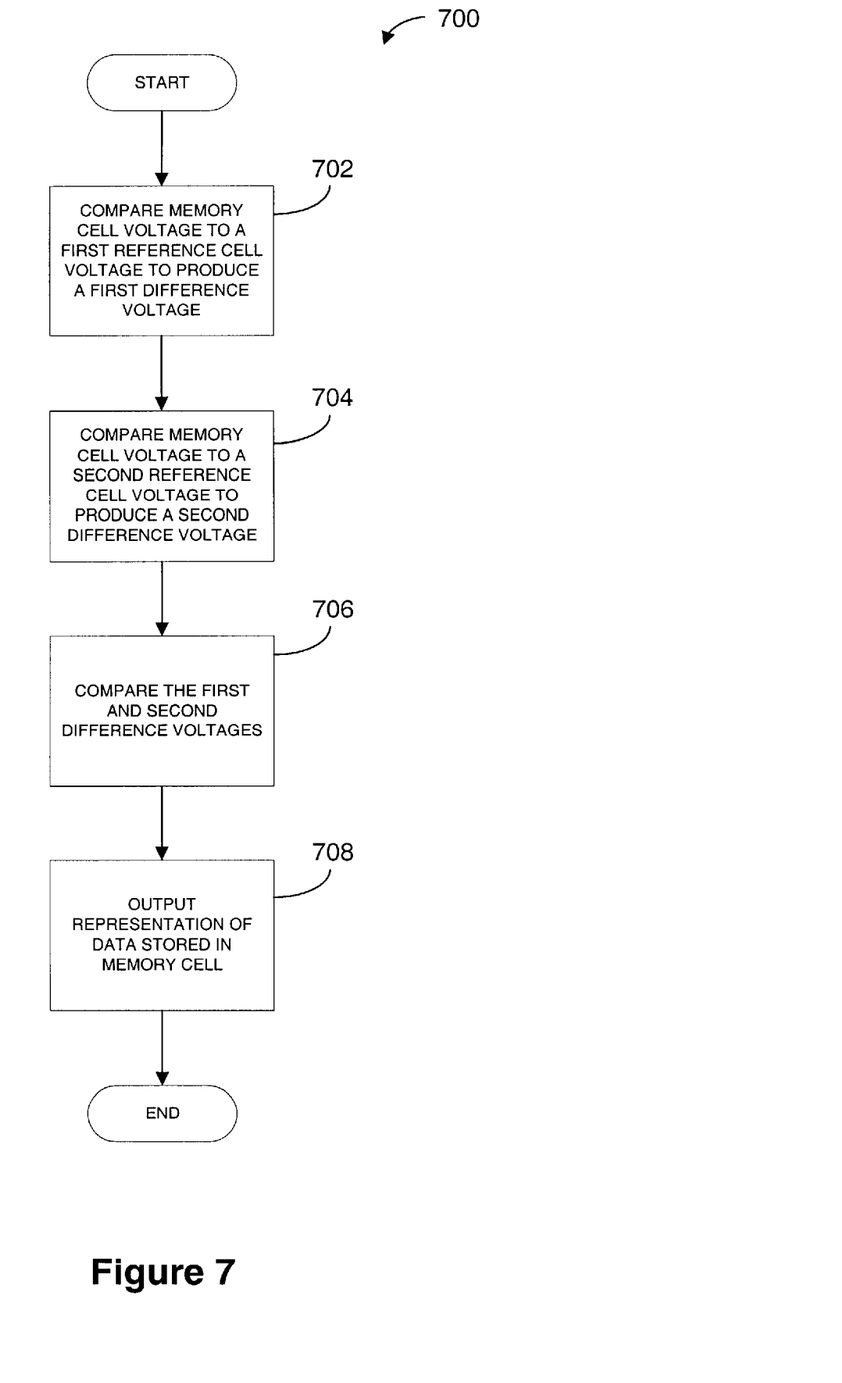
FIG. 7 is a flowchart diagram that illustrates the method operations performed in reading a non-volatile memory with dual reference cells in accordance with one embodiment of the present invention.

FIG. 7 is a flowchart diagram 700 that illustrates the method operations performed in reading a non-volatile memory with dual reference cells in accordance with one embodiment of the present invention. The method begins in operation 702 in which the output voltage of the memory cell (e.g., memory cell voltage $V_{cel}$) is compared to a first reference voltage output from a first reference cell to produce a first difference voltage (e.g., ΔCP1). In one embodiment, tThe first reference voltage is a low voltage. In operation 704, the output voltage of the memory cell (e.g., memory cell voltage $V_{cel}$) is compared to a second reference voltage output from a second reference cell to produce a second difference voltage (e.g., ΔCP2). In one embodiment, the second reference voltage is a high voltage. In operation 706, the first and second difference voltages (e.g., ΔCP1 and ΔCP2) are compared. This comparison produces an output signal, which is output in operation 708. In one embodiment, the output signal includes an amplified representation of the data stored in the memory cell. Once the representation of the data stored in the memory cell is output, the method is done.

Although the foregoing invention has been described in some detail for purposes of clarity of understanding, it will be apparent that certain changes and modifications may be practiced within the scope of the appended claims. Accordingly, the exemplary embodiments are to be considered as illustrative and not restrictive, and the invention is not to be limited to the specific details shown and described herein, but may be modified within the scope and equivalents of the appended claims.

What is claimed is:

1. A system for reading data in a memory cell, comprising:
a first comparator having a first input and a second input;
a second comparator having a first input and a second input;
a first reference cell having a low reference voltage coupled to the first input of the first comparator;
a second reference cell having a high reference voltage coupled to the first input of the second comparator;
a memory cell having a memory cell voltage coupled to the second input of the first comparator and the second input of the second comparator; and a third comparator having a first input and a second input, the first input of the third comparator being coupled to an output signal of the first comparator, and the second input of the third comparator being coupled to an output signal of the second comparator, wherein the output signal of the first comparator includes a difference voltage between the memory cell voltage and the low reference voltage and wherein the output signal of the second comparator includes a difference voltage between the memory cell voltage and the high reference voltage.

2. The system of claim 1, wherein the low reference voltage is substantially equal to the memory cell voltage when the memory cell is in a low voltage state.

3. The system of claim 1, wherein the high reference voltage is substantially equal to the memory cell voltage when the memory cell is in a high voltage state.

4. The system of claim 1, wherein the first reference cell is coupled to a ground potential such that the low reference voltage is substantially equal to the ground potential.

5. The system of claim 1, wherein the first reference cell includes a first voltage divider circuit.

6. The system of claim 5, wherein the second reference cell includes a second voltage divider circuit.

7. The system of claim 1, wherein an output of the third comparator is a representation of data stored in the memory cell.

8. A method for reading data in a memory cell, the method comprising the operations of:

comparing a first reference cell voltage and a memory cell voltage from a memory cell to produce a first output signal;

comparing a second reference cell voltage and the memory cell voltage to produce a second output signal, the second reference cell voltage being different from the first reference cell voltage; and comparing the first output signal and the second output signal to produce a third output signal.

9. The method of claim 8, wherein first reference cell voltage is a low reference voltage.

10. The method of claim 9, wherein the low reference voltage is substantially equal to the memory cell voltage when the memory cell is in a low voltage state.

11. The method of claim 8, wherein second reference cell voltage is a high reference voltage.

12. The method of claim 11, wherein the high reference voltage is substantially equal to the memory cell voltage when the memory cell is in a high voltage state.

13. The method of claim 8, wherein the third output signal is a representation of data in the memory cell.

14. The method of claim 9, wherein the low reference voltage is substantially equal to a ground potential.

15. The method of claim 8, wherein the first reference cell includes a first voltage divider circuit.

16. The method of claim 15, wherein the second reference cell includes a second voltage divider circuit.

17. An apparatus for reading data contained in a memory cell, comprising:

a first reference cell having a high threshold voltage for providing a low reference current;

a second reference cell having a low threshold voltage for providing a high reference current;

a first load for receiving the high reference current and outputting a first reference voltage;

a second load for receiving the low reference current and outputting a second reference voltage;

a first comparator for receiving the first reference voltage and a memory cell voltage and generating an output signal;

a second comparator for receiving the second reference voltage and the memory cell voltage and generating an output signal; and a third comparator for receiving the output signals from the first and second comparators and generating an output signal.

18. The apparatus of claim 17, wherein the first and second loads include at least one resistor.

19. The apparatus of claim 17, wherein the first and second loads include at least one capacitor.

20. The apparatus of claim 17, wherein the output signal from the third comparator represents data contained in the memory cell.

* * * * *